(12) United States Patent
Guterman

(10) Patent No.: US 6,539,453 B1
(45) Date of Patent: Mar. 25, 2003

(54) STORAGE SYSTEM INCLUDING MEANS FOR MANAGEMENT OF A MEMORY WITH ANTI-ATTRITION, AND PROCESS OF ANTI-ATTRITION MANAGEMENT OF A MEMORY

(75) Inventor: Pascal Guterman, Roquevaire (FR)

(73) Assignee: Gemplus, Cedex (FR)

( * ) Notice: Subject to any disclaimer, the term of this patent is extended or adjusted under 35 U.S.C. 154(b) by 0 days.

(21) Appl. No.: 09/468,879

(22) Filed: Dec. 22, 1999

(30) Foreign Application Priority Data

Dec. 22, 1998 (FR) .............................. 98 16216

(51) Int. Cl.$^7$ .............................................. G06F 12/00
(52) U.S. Cl. ..................... 711/103; 711/156; 711/170
(58) Field of Search ............................... 711/103, 156, 711/206, 170; 714/710; 365/185.02

(56) References Cited

U.S. PATENT DOCUMENTS

| | | | | |
|---|---|---|---|---|
| 5,420,993 A | * | 5/1995 | Smith et al. | 711/206 |
| 5,896,393 A | * | 4/1999 | Yard et al. | 714/710 |
| 5,920,501 A | * | 7/1999 | Norman | 365/185.02 |
| 6,009,497 A | * | 12/1999 | Wells et al. | 711/103 |
| 6,014,725 A | * | 1/2000 | Kind et al. | 711/103 |
| 6,032,237 A | * | 2/2000 | Inoue et al. | 711/163 |
| 6,038,636 A | * | 3/2000 | Brown, III et al. | 711/103 |
| 6,088,759 A | * | 7/2000 | Hasbun et al. | 711/103 |
| 6,092,160 A | * | 7/2000 | Marsters | 711/156 |
| 6,115,785 A | * | 9/2000 | Estakhri et al. | 711/103 |
| 6,161,163 A | * | 12/2000 | Komatsu et al. | 711/103 |
| 6,167,483 A | * | 12/2000 | Miyauchi | 711/103 |
| 6,230,233 B1 | * | 5/2001 | Lofgren et al. | 711/103 |
| 6,230,234 B1 | * | 5/2001 | Estakhri et al. | 711/103 |

* cited by examiner

*Primary Examiner*—David Hudspeth
*Assistant Examiner*—Fred F. Tzeng
(74) *Attorney, Agent, or Firm*—Burns, Doane, Swecker & Mathis, L.L.P.

(57) ABSTRACT

The invention relates to a storage system including at least one non-volatile memory containing information likely to be updated, and more particularly, to storage supports such as chip cards. The invention likewise relates to a process of management of the memory. According to the invention, the system includes a memory manager that is able to displace all or a portion of the contents of the memory respectively over all or a portion of the memory, in order to limit the attrition of memory cells due to the frequent updating of certain data.

29 Claims, 3 Drawing Sheets

STORAGE SYSTEM INCLUDING MEANS FOR MANAGEMENT OF A MEMORY WITH ANTI-ATTRITION, AND PROCESS OF ANTI-ATTRITION MANAGEMENT OF A MEMORY

This disclosure is based upon, and claims priority from French patent application No. 98 16216 filed Dec. 22, 1998, the contents of which are incorporated by reference herein.

FIELD OF THE INVENTION

The invention relates to a storage system including at least one memory, and means for the management of the memory with anti-attrition, in a manner such as to increase the life of the memory. The invention likewise relates to a process of anti-attrition management of such a memory.

The invention is applied to any memory which is non-volatile or whose content is backed up, and is likely to have frequent updates of certain data. The invention is particularly applied to storage supports such as chip cards, so-called "smart cards".

BACKGROUND OF THE INVENTION

The manufacturers of memories of the EPROM, EEPROM, and FeRAM types know that whatever the technology of the non-volatile memories, there is a maximum number N of possible read-write operations for each cell constituting a memory. Indeed, it is considered that a memory is worn out when the number of write and/or read operations has reached this maximum number N. That is, beyond this number there is a risk of alteration of information, or a loss of data which may be written in the memory.

According to the invention, it is sought to reduce the attrition of the non-volatile memory cells in which numerous write accesses (in the case of EPROM or EEPROM memories), or read accesses (in the case of FeRAM memories), have to be carried out, for certain data.

In the prior art, solutions of this problem have been sought by isolating the data which are considered as sensitive, that is, the data which are often updated, in a portion reserved for this purpose in the memory. Unfortunately, there is a fatigue of the zones concerned, which results because these updates are always carried out for the same data and always for the same memory cells.

A solution of this problem has been sought by dividing the reserved portion into several zones, so as to implement a device for the distribution of the attrition of information during successive write operations of new data. This makes it possible to avoid the loss of information due to an attrition of the memory cells dedicated to the information. In practice, the datum or data preceding the new datum is, or are, preserved in the dedicated zone or zones.

However, no solution heretofore presented is sufficiently satisfactory. In other words, none of the solutions significantly lengthens the life of such a memory.

An object of the present invention is to solve these problems.

Another object of the invention is to provide a solution to the attrition of memories, including the cases in which it is not known a priori which are the memory cells which will be stressed. This will more and more be the case with the possibility which is offered of loading interpretable programs (a program that is constituted by data in an interpretable language) into the cards. The loading of interpretable programs could be downloadings carried out by the users themselves.

Another object of the invention is to provide a solution to the espionage of sensitive data, since these data will be displaced in the memory, as will be seen hereinafter in a detailed manner.

SUMMARY OF THE INVENTION

The invention has as its first subject a storage system comprising at least one non-volatile memory containing information which is likely to be updated, principally characterized in that it includes means for management of this memory, able to displace, over all or a portion of the memory, respectively all or a portion of the content of the memory.

In practice, the whole content of the memory will be displaced with the exception of the data which will be in this memory and for which it is imperative to maintain the physical address. This is the case, for example, of management (and/or instruction) data for the mechanism implemented by the management means according to the invention. If these data are stored in this memory, then the memory portion containing all of these data (and/or instructions) will not be displaced.

In the example of chip cards, this can also be the case for data such as the serial number of the card, or logic locks. In the case in which all of these data will be in another memory of the card, then all of the contents of the managed memory will be displaced.

The memory management means is able to effect displacements of an iterative manner. The displacements effected in an iterative manner are cyclic. The means for displacement include:

means for the transfer of a first region to a second region.

means for address conversion such that all the requests for access to the first region are converted into requests for access to the second region, into which the content of the first region has been transferred.

The displacement means operate by progressive shifting of the contents of a first region to a second region.

According to a preferred embodiment, the memory is organized into regions comprising one or more cells, at least one of these regions is empty, and the management means operate progressive shifts of the contents of a first region to a second region, the second region being the region which is empty, or was emptied during a preceding shift.

The displacement means for progressive shifting of the content of a first region into a second, empty or emptied, region furthermore includes means for control of the shifting. The means for control of the shifting can be constituted by a clock signal. Alternatively, the means for control of the shifting is constituted by a control signal of a random character. The means for control of the shifts includes counting means of comparison of the number of accesses to the memory with respect to a predetermined threshold.

The transfer means includes a program for reading out all the first region concerned and for writing in the second region concerned. The means for address conversion include a logic unit implemented by a program, or a physical unit constituted by a logic circuit in the addressing circuit of the memory.

In a particular application of the invention, the storage system is constituted by a chip card.

Another subject of the invention is a process of the management of a non-volatile memory containing information which is likely to be updated, principally characterized in that it includes a step of displacement, over all or a portion of the memory, respectively of all or a portion of the content of the memory.

According to a preferred embodiment of the invention, the memory is organized into regions, and the step of displacement includes steps of transfer of the contents of the regions. Advantageously, the process includes the step of:

provided at least one free region in the memory, the information which is to be recorded in the memory being recorded in the regions of the memory other than this empty region.

According to this embodiment, the displacement step is effected by the progressive shifting of the content of a first region to a second region, the second region being the empty region or the region emptied during a preceding shift.

The progressive shifting comprises a step of:

marking the new free region.

The step of displacement furthermore includes a step of address conversion such that all the requests for access to the first region are converted into requests for access to the second region, into which the contents of the first region has been transferred.

The step of progressive shifting includes a step of control of the shifting. The control of the shifting can be constituted by a clock signal, or a signal having random characteristics.

According to another embodiment, the step of control of shifting includes a count of the number of accesses to the memory and a comparison of this number of accesses to a predetermined threshold (S) for the number. The transfer step is effected by means of a program for reading out all the first region concerned and for writing into the second region concerned.

BRIEF DESCRIPTION OF THE DRAWINGS

Other advantages and features of the invention will become apparent from the following description, with reference to the accompanying drawings.

DETAILED DESCRIPTION

The invention will now be described in the context of a particular application in which the non-volatile memory (or backed-up memory) contains data which are to be updated, and is located in a chip card 1.

Figure 1:
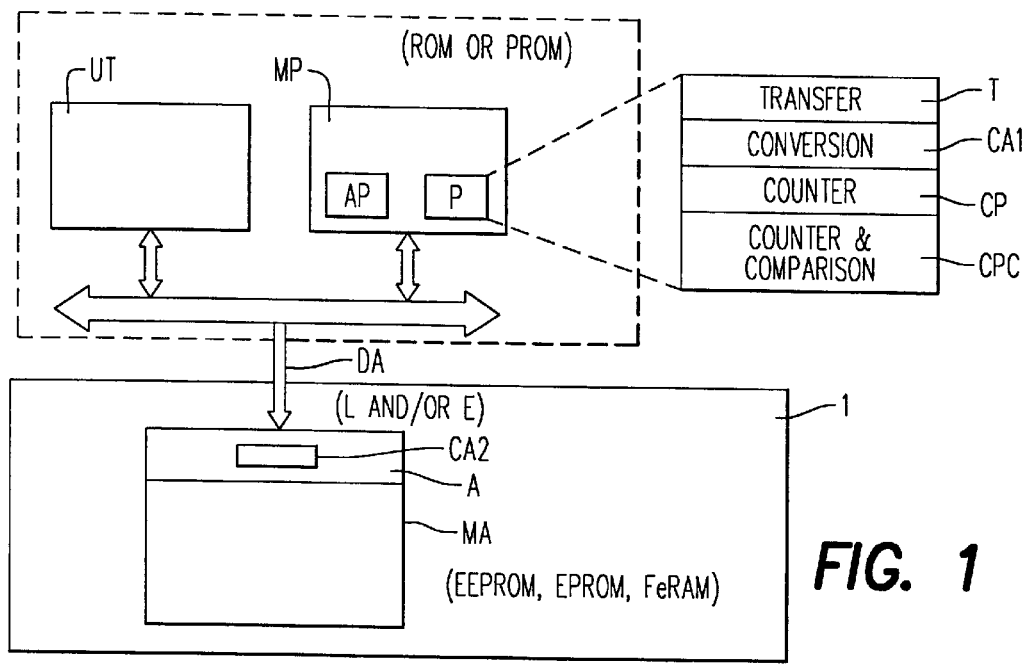
FIG. 1 is a diagram of a storage system according to a first embodiment.
Figure 2:
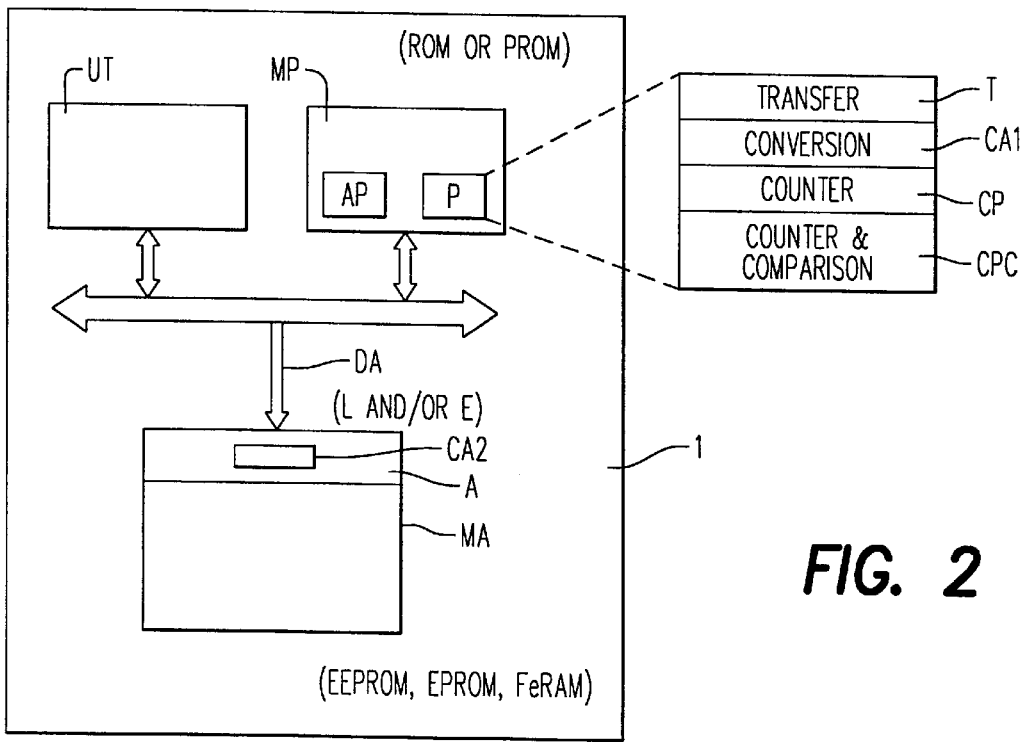
FIG. 2 is a diagram of a storage system according to a second embodiment.

The diagrams of FIGS. 1 and 2 illustrate the two possible configurations for a chip card. In FIG. 1, the chip card 1 includes only the memory MA for data (and/or interpretable programs), some of which are likely to be updated. The management means 2 of the memory MA is set apart, in this case in the chip card reader. In FIG. 2, the chip card includes both the management means 2 for the memory, and the memory MA itself.

These two representations are conventional. There exist in commerce, chip cards which include only memory, and chip cards which include a microprocessor with its program memory, and the memory for the application or applications provided. The invention is thus applied to any storage system including management means, whether the management means for the memory is on the same support as the memory itself, or is set apart, for example in a chip card reader.

FIG. 1 shows, more particularly, management means formed by a processing unit UT, which is, for example, a microprocessor, and a program memory MP (ROM or PROM) associated with this microprocessor UT. This program memory MP generally includes an application program AP. According to the invention, the program memory likewise includes a program P enabling the implementation of the management mechanisms which will be described hereinafter.

The management means 2 for the memory MA for application data is consequently constituted by the processing unit UT and at least one program memory MP, which contains the program P able to implement the management mechanism of this memory MA. For this purpose, this program P contains a subprogram T for data transfer, a program CPC for counting the number $N_{AD}$ of accesses to the memory MA, and for comparison of the number of accesses $N_{AD}$ with a predetermined threshold S.

This program P can likewise contain a conversion program CA1 which will permit physical address conversions to be made for a logical address requested by the application program AP. This conversion means can in fact be realized directly at the level of the memory MA by a hardwired logic circuit CA2 contained, for example, in the addressing circuit A of the memory MA. The choice can indeed be made, in the case of existing systems, of implementing the physical address conversion mechanism in a sub-program CA1 of the program memory, as has just been said. But for new systems and for new memories, there can, likewise, be provided, at the manufacturing stage, a logic circuit CA2 which is able to effect these physical address conversions.

Figure 3:
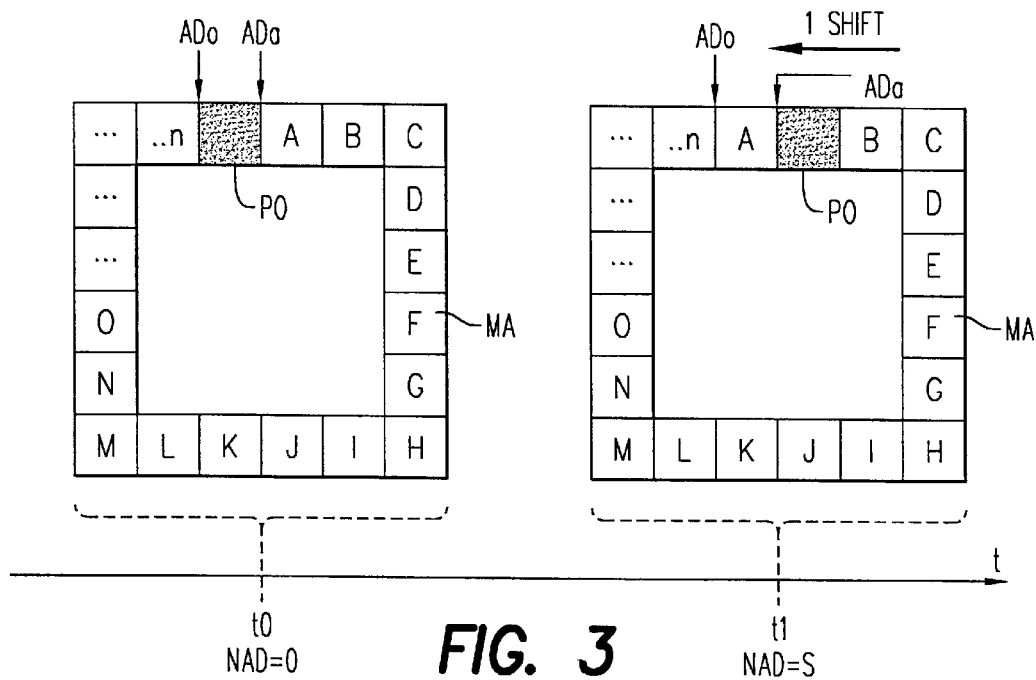
FIG. 3 shows schematically a memory plane, illustrating the mechanism implemented by the management means according to the invention.
Figure 4:
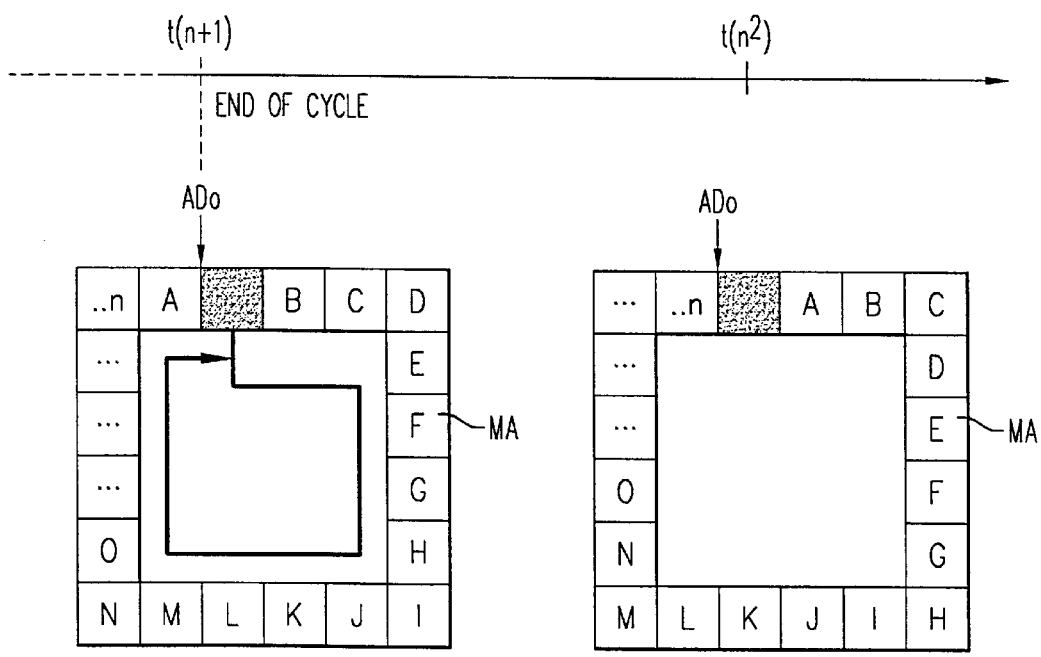
FIG. 4 illustrates this mechanism at the end of a complete cycle.
Figure 5:
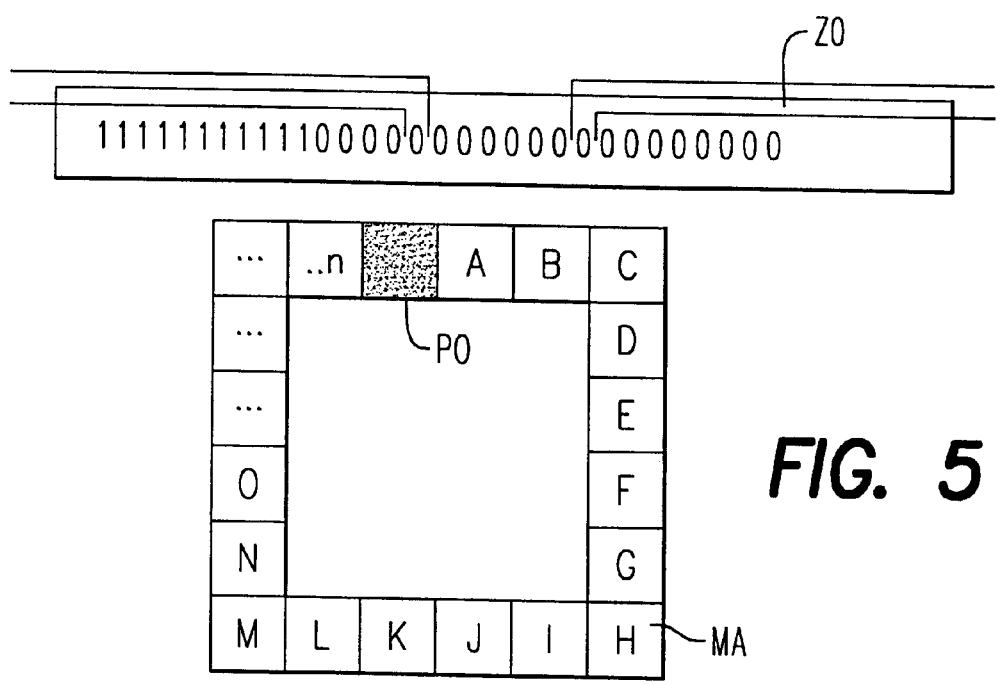
FIG. 5 schematically illustrates a means for marking the empty region according to the invention.

The management mechanisms implemented by the management means according to the invention will be illustrated by means of FIGS. 3, 4 and 5.

The representation of the memory plane in the form of a crown is fictitious; it simply enables the mechanism which is put into effect to be well illustrated, and resembles a picture puzzle. What is adopted is simply that the memory is dissected or physically organized into regions A, B, C, . . . n, and that regions can be formed by a single memory cell, for example, or from a set of memory cells, according to the technology utilized. By way of example, in an EEPROM memory, the memory is organized into regions called pages, each page having a size of several bytes.

The diagram of FIG. 3 illustrates, in the memory plane, a first plane taken at the instant t0, an instant at which the number of memory accesses $N_{AD}$ is zero, for example, and a second plane at the instant t1, an instant for which this number of accesses NAD has reached the predetermined threshold S.

At the instant t0, the regions A, B, C, . . . n and an empty region P0 can be marked. At the instant t1, it can be observed that the contents of the region A have passed into the empty region P0, the empty region P0 being now that which is at the physical address of the region A at the instant To.

The mechanism has consequently permitted a shift of the contents of the region A into the empty region P0. The new region P0 is located in the previous site of the region A. The mechanism has consequently permitted a transfer of the data of the region A into the empty region P0.

This mechanism furthermore permits, with respect to the application program A which makes access requests DA (read or write operations) to logical addresses for data located in the region A, a conversion to be effected of the physical address (corresponding to the requested logical address) to the physical address which is that which corresponds to the new site of the data in the region A. The order in which to effect a transfer from a region A to the empty or emptied region P0 is passed by the management means, that is, by the program P when the sub-program for counting the number $N_{AD}$ of accesses has reached the predetermined threshold S.

FIG. 4 illustrates the mechanism according to the invention when all the shifts have been operated which are necessary to obtain a shift of all the regions of the memory. If the number of regions is n, the number of shifts carried out by the memory management means will be equal to this number n, in a manner such that all the contents of the memory have been transferred from one region to another region, by utilizing the starting region, then the region which has been emptied at each shift. All of the regions will thus be shifted cyclically.

By way of example, if there are n=100 regions (or pages), the management mechanism will proceed to 100×100 shifts to come back to the starting point which corresponds to the original physical address $A_{D0}$ of the page $P_0$.

FIG. 5 illustrates a means for marking the site of the empty region P0. In order to effect this marking, a zone Z0 is provided which can be situated in a fixed zone of this memory NA, reserved for this purpose, or in an electrically programmable memory zone of the management system. This zone has a length at least equal to n bits, where n corresponds to the number of shifts to effect one complete cycle of shifts (shift of all the regions).

The mechanism according to the invention permits a bit to be set to 1 each time the empty region P0 is displaced. This region Z0 thus permits marking of the physical site of the empty region. Another counter will permit the counting of the number of complete cycles of shifts. This counter CP can be implemented by the program P, for example.

Thus for any memory having a limited number of accesses (due to the phenomenon of aging), the application program utilizing the memory will be able to make all the desired accesses without risk, by the use of the management means which implements the mechanism which has just been described. This mechanism permits arranging for the data of the memory regions which are most often modified (or read) to not always be situated in the same regions, but that for all the regions they are displaced from one region to another without any need for these regions to be identified.

At a given instant, the data of a region are, for example, at the beginning of the memory and will progressively shift to the end, to recommence on coming to the beginning. The application program effects its read-write accesses without taking account of the physical place having been changed of the data to which it desires access.

By way of example, without the mechanism of the invention, if an application program makes requests for access to a single memory cell and if it makes access to it N=1,000,000 times, for example, it will have destroyed the cell at the end of N times, and the memory will no longer be able to be used. By means of the mechanism, the program will make access, for example, 1,000,000 times to an item of information, but this information will have been successively displaced over 100 cells, for example, and each cell was stressed 10,000 times.

The regions (the cells) in which the data are stored for which regular updates are to be performed during the life of the card are more stressed than the others by the application program. The invention thus permits such a program to not always stress, for a datum to be updated, the same cells or the same regions. The program will stress for this datum another set of cells of the memory, then again another set of cells, etc. The attrition brought about by the updates of this datum will consequently be distributed over several sets of cells or regions.

The management means which are implemented in order to obtain this distribution of stress make it possible to have complete transparency with respect to the application program. The application program passes its access orders (read or write instructions) to a logical address; the management means receives these instructions and conventionally sets up the correspondence between the physical address and the requested logical address, as long as the datum has not been transferred to another physical address. The management means effects a conversion of the physical address for the datum each time a shift takes place, that is, the transfer takes place of the contents of the region in which this datum is located into another region.

What is claimed is:

1. A storage system having a non-volatile memory comprising a plurality of storage regions in which data can be stored and at least one empty region, and a memory manager that operates to cyclically transfer contents of a storage region into said empty region wherein, for each cycle, upon the occurrence of a designated event, said memory manager transfers the contents of a given storage region into said empty region and said given storage region becomes the empty region for a subsequent cycle, in accordance with a predetermined pattern such that, after a preset number of cycles, the contents of each of said storage regions will have been transferred to an empty region.

2. The storage system of claim 1 wherein said preset number of cycles is equal to the number of storage regions.

3. The storage system of claim 1 wherein said designated event is a clock signal.

4. The storage system of claim 1 wherein said designated event is a random control signal.

5. The storage system of claim 1 wherein said memory manager includes a counter for counting accesses to said memory, and said designated event occurs when the counted number of accesses reaches a predetermined threshold value.

6. The storage system of claim 1, wherein said memory manager includes means for converting a logical address associated with said given storage region into a physical address associated with the empty region into which the contents of said given storage region have been transferred.

7. The storage system of claim 6 wherein said converting means comprises a logical unit implemented in a software program.

8. The storage system of claim 6 wherein said converting means comprises a hardware logic circuit implemented in an address circuit of said memory.

9. The storage system of claim 1, wherein said memory is contained within a chip card.

10. The storage system of claim 9, wherein said memory manager is also contained on said chip card.

11. The storage system of claim 9, wherein said memory manager is disposed in a reader to which the chip card can be connected.

12. A storage system comprising:
a non-volatile memory having a plurality of storage regions in which data can be stored and at least one empty region;
a counter for counting accesses to said memory; and a memory manager that detects when the counted number of accesses reaches a predetermined threshold value and, in response thereto, transfers the contents of a given storage region into said empty region such that said given storage region becomes the empty region for a subsequent cycle.

13. The storage system of claim 12, wherein said memory manager includes means for converting a logical address associated with said given storage region into a physical address associated with the empty region into which the contents of said given storage region have been transferred.

14. The storage system of claim 13 wherein said converting means comprises a logical unit implemented in a software program.

15. The storage system of claim 13 wherein said converting means comprises a hardware logic circuit implemented in an address circuit of said memory.

16. The storage system of claim 12, wherein said memory is contained within a chip card.

17. The storage system of claim 16, wherein said memory manager is also contained on said chip card.

18. The storage system of claim 16, wherein said memory manager is disposed in a reader to which the chip card can be connected.

19. The storage system of claim 12 wherein said memory manager iteratively transfers the contents of a storage region to the empty region upon each detection of said threshold such that, after a preset number of iterations, the contents of each of said storage regions will have been transferred to an empty region.

20. The storage system of claim 19, wherein said preset number is equal to the number of storage regions.

21. A method for managing a non-volatile memory having a plurality of storage regions in which data can be stored and at least one empty region, comprising the step of cyclically transferring contents of a storage region into said empty region in accordance with a predetermined pattern such that, after a preset number of cycles, the contents of each of said storage regions will have been transferred to an empty region.

22. The method of claim 21, wherein said preset number of cycles is equal to the number of storage regions.

23. The method of claim 21 wherein, for each cycle, upon the occurrence of a designated event, said memory manager transfers the contents of a given storage region into said empty region and said given storage region becomes the empty region for a subsequent cycle.

24. The method of claim 23 wherein said designated event is a clock signal.

25. The method of claim 23 wherein said designated event is a random control signal.

26. The method of claim 23 further including the step of counting accesses to said memory, and wherein said designated event occurs when the counted number of accesses reaches a predetermined threshold value.

27. The method of claim 21, further including the step of converting a logical address associated with said given storage region into a physical address associated with the empty region into which the contents of said given storage region have been transferred.

28. A method for managing a non-volatile memory having a plurality of storage regions in which data can be stored and at least one empty region, comprising the steps of:

counting accesses to said memory;

detecting whether the counted number of accesses reaches a predetermined threshold value; and transferring contents of a given storage region into said empty region upon detecting that the counted number of accesses reaches said threshold.

29. The method of claim 28 further including the step of converting a logical address associated with said given storage region into a physical address associated with the empty region into which the contents of said given storage region have been transferred.

* * * * *